(12) United States Patent
Teixeira

(10) Patent No.: US 7,977,211 B2
(45) Date of Patent: Jul. 12, 2011

(54) METHOD FOR REDUCING THE THICKNESS OF SUBSTRATES

(75) Inventor: Ricardo Cotrin Teixeira, Leuven (BE)

(73) Assignees: IMEC, Leuven (BE); Katholieke Universiteit Leuven, Leuven (BE)

( * ) Notice: Subject to any disclaimer, the term of this patent is extended or adjusted under 35 U.S.C. 154(b) by 80 days.

(21) Appl. No.: 12/531,463

(22) PCT Filed: Apr. 8, 2008

(86) PCT No.: PCT/EP2008/054207
§ 371 (c)(1),
(2), (4) Date: Oct. 2, 2009

(87) PCT Pub. No.: WO2008/125543
PCT Pub. Date: Oct. 23, 2008

(65) Prior Publication Data
US 2010/0112782 A1    May 6, 2010

Related U.S. Application Data

(60) Provisional application No. 60/912,240, filed on Apr. 17, 2007.

(51) Int. Cl.
*H01L 21/30* (2006.01)
*H01L 21/46* (2006.01)

(52) U.S. Cl. . 438/459; 438/690; 438/977; 257/E21.304; 257/E21.305

(58) Field of Classification Search ............... 438/459, 438/690, 977; 257/E21.304, E21.305, E21.306; 216/52, 53; 451/53, 1
See application file for complete search history.

(56) References Cited

U.S. PATENT DOCUMENTS

| | | | |
|---|---|---|---|
| 6,180,527 B1 | 1/2001 | Farnworth et al. | |
| 7,393,790 B2 * | 7/2008 | Britt et al. | 438/692 |
| 7,763,543 B2 * | 7/2010 | Nagaya et al. | 438/700 |
| 2006/0046433 A1 | 3/2006 | Sterrett et al. | |

FOREIGN PATENT DOCUMENTS

| | | |
|---|---|---|
| EP | 0337556 A1 | 10/1989 |
| JP | 9117859 A | 5/1997 |
| WO | WO 98/09804 A1 | 3/1998 |

* cited by examiner

*Primary Examiner* — Caridad M Everhart
(74) *Attorney, Agent, or Firm* — Knobbe Martens Olson & Bear LLP

(57) ABSTRACT

The current invention presents a method for thinning wafers. The method uses a two-step process, whereby first the carrier wafer (2) is thinned and in a second step the device wafer (1) is thinned. The method is based on imprinting the combined thickness non-uniformities of carrier (2) and glue layer (3) essentially on the carrier (2), with a resulting low TTV of the wafer (100) after thinning.

20 Claims, 4 Drawing Sheets

(a)

(b)

(c)

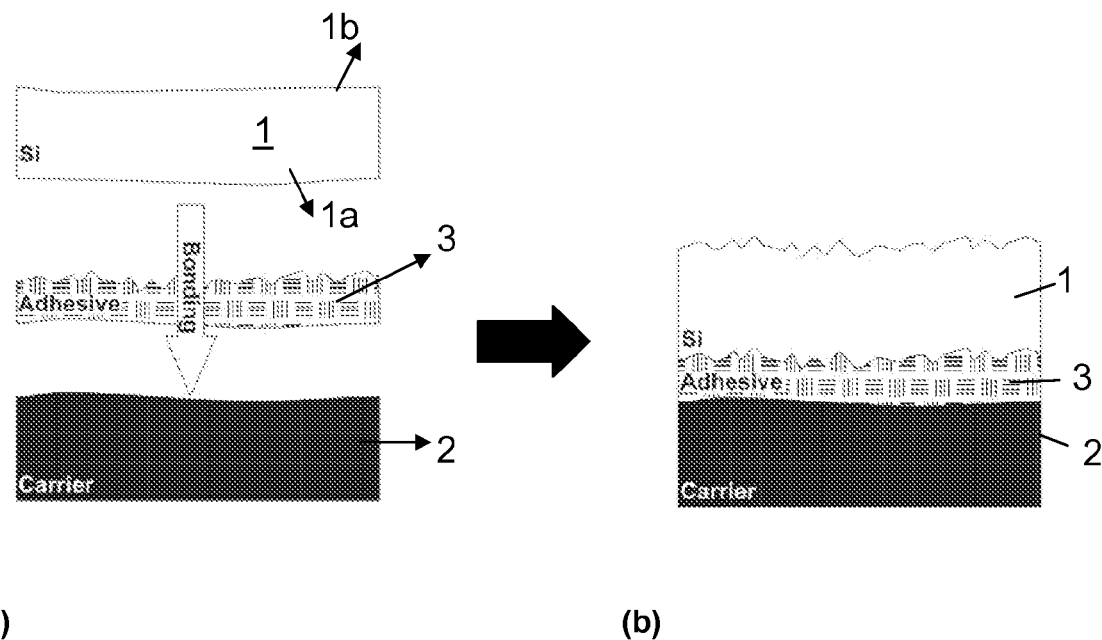
Figure 1
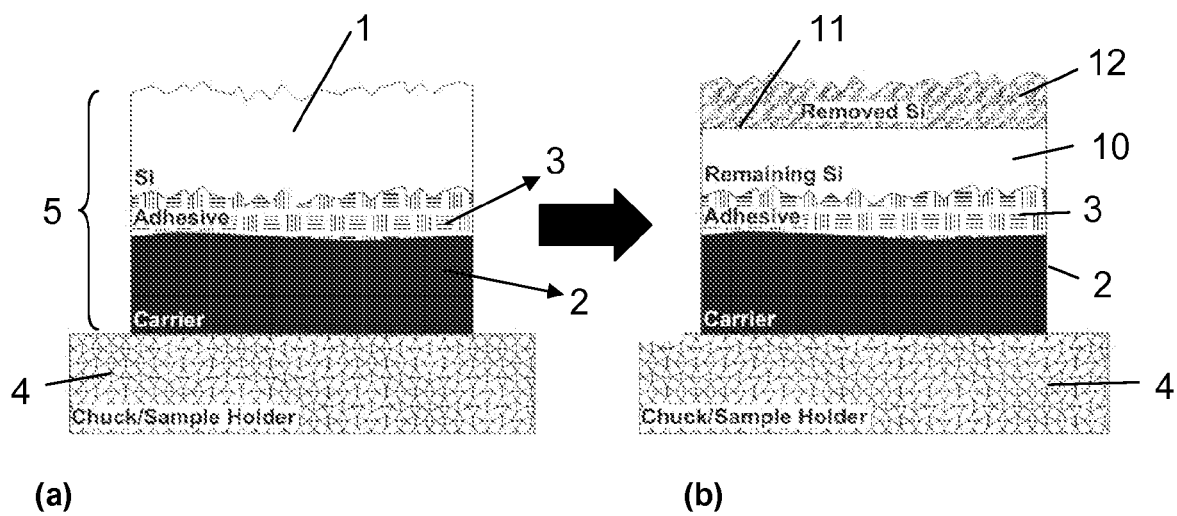
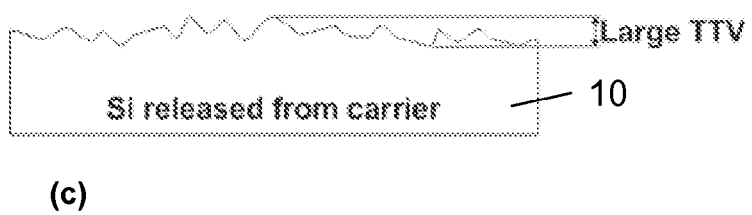
Figure 2 – prior art

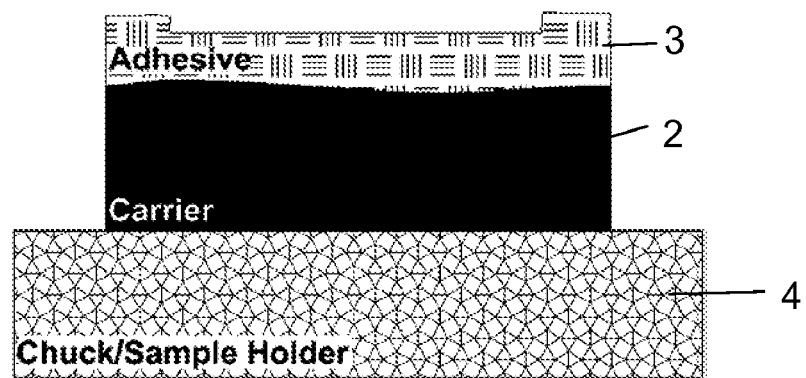
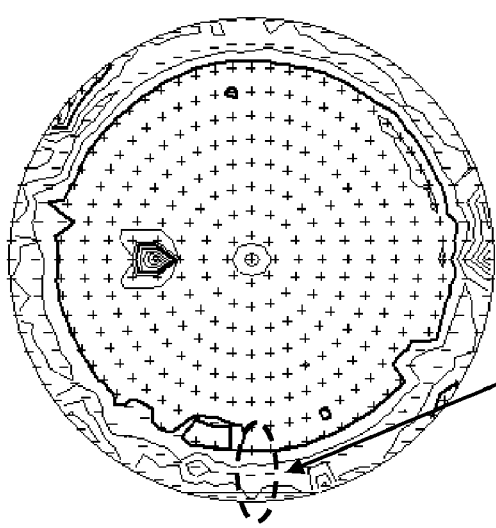
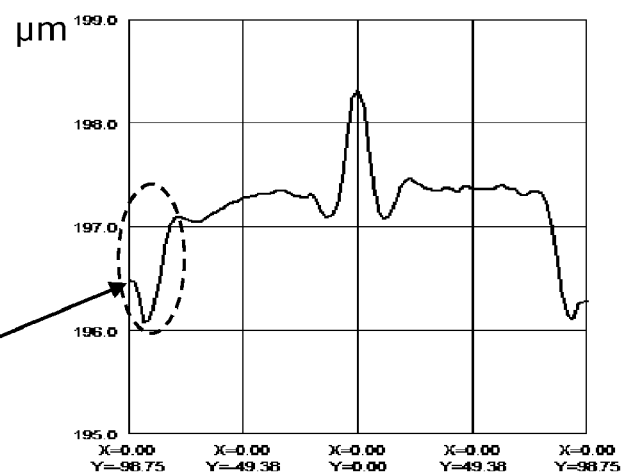
Figure 4 – prior art

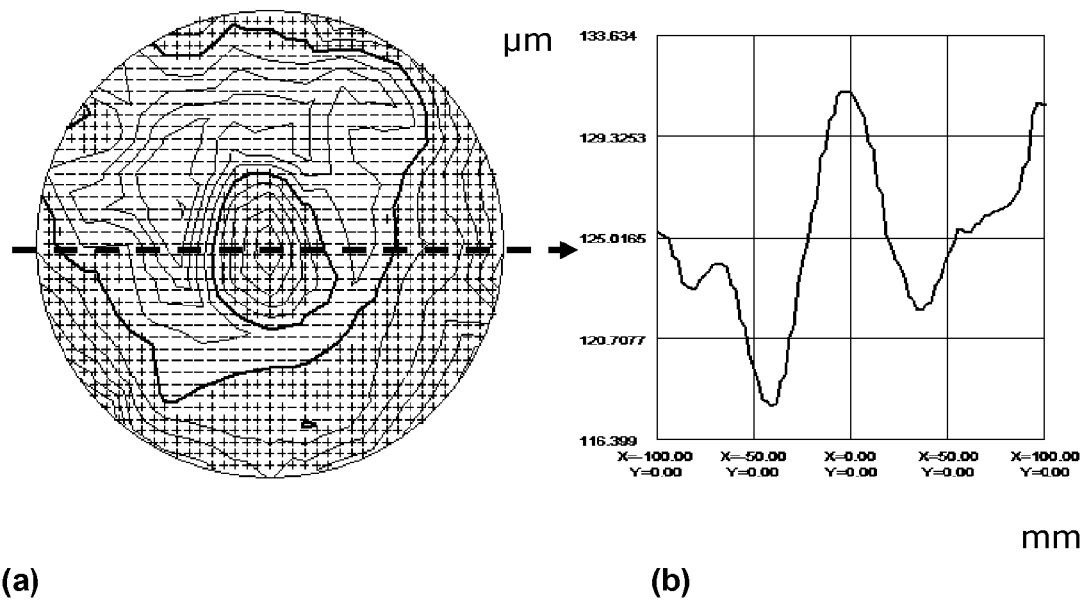
(a)                                (b)
Figure 5 – prior art
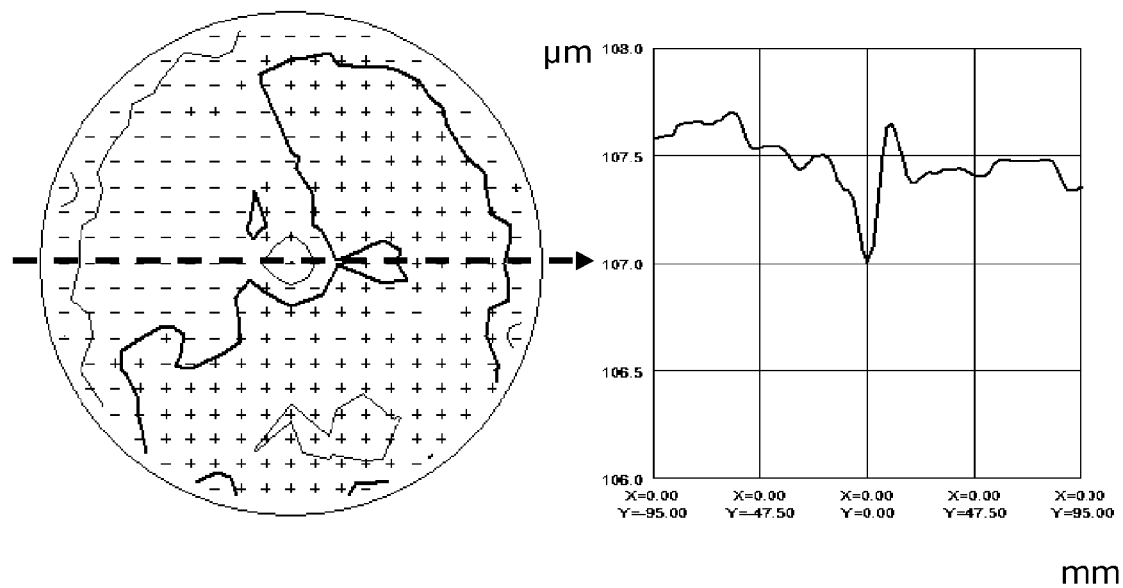
(a)                                (b)
Figure 6

METHOD FOR REDUCING THE THICKNESS OF SUBSTRATES

CROSS-REFERENCE TO RELATED APPLICATIONS

This application is the national phase under 35 U.S.C. §371 of prior PCT International Application No. PCT/EP2008/054207 which has an International filing date of Apr. 8, 2008, which designates the United States of America, and which claims the benefit of U.S. provisional application Ser. No. 60/912,240 filed Apr. 17, 2007, the disclosures of which are hereby expressly incorporated by reference in their entirety and are hereby expressly made a portion of this application.

TECHNICAL FIELD OF THE INVENTION

The present invention relates to the field of wafer or substrate thinning in semiconductor processing technology.

BACKGROUND OF THE INVENTION

Wafer grinding is used in the semiconductor industry for reducing the thickness during wafer fabrication. After the initial slicing from the ingot follows a series of steps to achieve the mirror like, low roughness surface required for device fabrication. One of these steps involves mechanical removal of the rough wire sawing profile and flattening of the surface, which can be done by lapping or grinding. A final polishing step (mechanical and/or chemical) follows to obtain a defect-free surface finish.

Because of the low cost (i.e. speed and the lack of polishing slurry required for processing) and the relatively low amount of damage induced, the grinding process has also been chosen to fulfill the requirements of thinning wafer/dies after the microelectronic devices fabrication for applications as smart cards and system stacking, e.g. memory for cell phones. Backside grinding after the microelectronic devices fabrication is largely used by the semiconductor industry to achieve die thicknesses that are moving down to 50 µm.

However, in this thickness range (<100 µm), the wafer becomes flexible and a carrier (e.g. Si or Glass wafer or a back grinding tape (BG-tape)) is used to provide mechanical support for the thin device wafer. The device wafer can be bonded to the carrier by means of a temporary glue layer (e.g. wax, resin or adhesive tape) or by using electrostatic force. Several products are available for this, depending on the requirements of the thinning process and following process steps. A problem with the use of a carrier and glue layer is that non-uniformities of the carrier or glue layer are transferred to the wafer during the thinning or grinding process, thereby increasing the total thickness variation (TTV) of the thinned device wafer.

Different techniques are used for wafer thinning, all having several drawbacks. U.S. 2006046433 describes the individual preparation of carriers for thinning semiconductor wafer by other methods such as lithography and etching. A disadvantage of this preparation of the carriers is that each individual carrier wafer must be adjusted to its particular device wafer. WO9809804 describes a flattening process for bonded semiconductor substrates by selective etching (wet or dry) to reduce the thickness variation. A disadvantage of this flattening process is that each wafer must be analyzed and processed individually.

JP9117859 describes a polishing method for thinning quartz to very small thicknesses (<50 µm). However it also requires dedicated processing, i.e. spinning and lithography of a resist on the device wafer and underfilling of the gaps between the carrier wafer and device wafer with an adhesive. Even though very small TTV in the range of 0.1 µm can be achieved and 2 wafers can be processed simultaneously, there is a need for special machinery for performing this process (double side polisher) and a large amount of consumables (polishing slurry, photo resists, developers, etc).

Another major drawback for all the references presented above comes from the high cost of ownership of the thinning procedure due to the amount of machinery, consumables and time required to prepare each wafer stack before the thinning itself can be performed.

SUMMARY OF THE INVENTION

It is an aim of the current invention to present a method for thinning a wafer whereby the thinned wafer has a low TTV.

The above objective is accomplished by a method according to embodiments of the present invention.

The present invention is related to a method as described in the appended claims. In particular, the presented method for thinning a device wafer may comprise the following steps. A first main surface of the device wafer is bonded to a first main surface of a carrier such that a composite substrate is formed. Then the composite substrate may be pulled with the non-bonded surface of the device wafer against a first reference (optionally flat) surface, for example a chuck of a polishing tool. In a next step the non-bonded main surface of the carrier is thinned. Afterwards the composite substrate may be pulled with the non-bonded surface of the carrier against a second (optionally flat) reference surface. Finally the non-bonded main surface of the device wafer is thinned.

The thinning processes applied in accordance with embodiments of the present invention may be such that they make the surface which is thinned parallel to the reference surface(s) (e.g. flat). Different techniques can be used for the thinning process, as for instance grinding, fly cutting, milling. The reference (e.g. flat) surface(s) can be the surface of a chuck or sample holder. The pulling force can be achieved by for instance vacuum clamping or electrostatic or mechanical clamping. The thinning may be performed by a thinning technique which performs a parallel thinning or material removal in combination with a very effective vacuum chuck. Examples of such techniques are grinding, fly-cutting, Chemical Mechanical Polishing (CMP).

After the thinning of the device wafer, all thickness non-uniformities on the composite wafer (the carrier, glue layer and device wafer) will be substantially imprinted on the bonded main surface of the carrier. In other words all the thickness non-uniformities on the composite wafer will be imprinted on the thickness of the carrier.

The device wafer can have a thickness of more than 600, or more than 500 or more than 400 or more than 300 or more than 200 or more than 100 microns or more than 50 microns before thinning and a thickness below 100 microns or below 90, below 80, below 70, below 60, below 50, below 40 below 30 below 20 below 10, below 5 after thinning. The thickness is limited by state of the art thinning techniques.

The device wafer and carrier may comprise any material, in embodiments of the present invention semiconductor material, which is known in the art to be thinnable by the respective thinning technique used. It may for example comprise e.g. silicon and/or germanium and/or compound semiconductors and/or glass.

The carrier may be chosen such that it provides an easy material removal for the corresponding thinning technique used. The carrier could alternatively be called a sacrificial wafer.

The first main surface of the device wafer may already comprise devices, but this is not necessary. This can for instance not be the case in wafer thinning processes for solar cell applications.

The bonding can comprise the application of a glue layer between the device wafer and the carrier In embodiments of the present invention the first and the second reference surface have the same shape. In embodiments of the present invention the first and the second reference surface are the same. In other embodiments, however, the first and second reference surfaces are physically different surfaces, which avoids the necessity of using different slurries and different pads on a same polishing device.

Particular and preferred aspects of the invention are set out in the accompanying independent and dependent claims. Features from the dependent claims may be combined with features of the independent claims and with features of other dependent claims as appropriate and not merely as explicitly set out in the claims.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 1: Schematics of a bonding process.

FIG. 2: Schematics of a grinding process in accordance with the prior art.

FIG. 4: Thickness map and scan of an 8" Si wafer after bonding and grinding as in the prior art, showing the influence of wax TTV on the thinned device wafer.

FIG. 5: Thickness map and scan of an 8" Si wafer after bonding and grinding as in the prior art, using a thicker glue layer than in the experiment represented in FIG. 4.

FIG. 6: Thickness map and scan of an 8" Si wafer showing a TTV of less than 1 μm on a wafer stack processed according to embodiments of the present invention.

Figure 3:
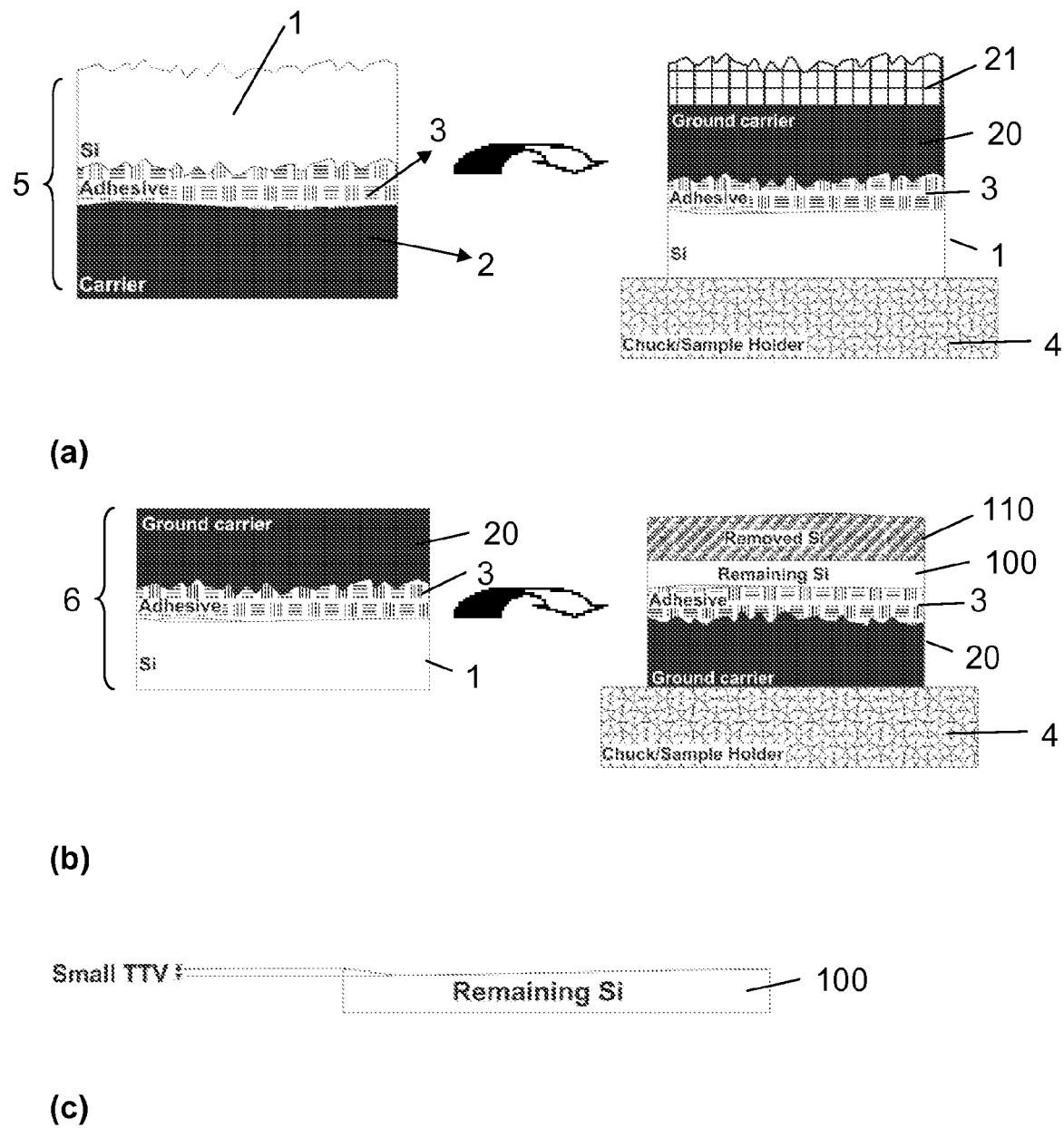
FIG. 3: Method for fabricating thinned device wafers with low TTV according to an embodiment of the present invention; (a) First step of the method (b) second step of the method, and (c) thinned device wafer after release from the carrier.

In the different figures, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

All numbers expressing quantities of ingredients, reaction conditions, and so forth used in the specification and claims are to be understood as being modified in all instances by the term "about". Accordingly, unless indicated to the contrary, the numerical parameters set forth in the specification and attached claims are approximations that may vary depending upon the desired properties sought to be obtained by the present invention. At the very least, each numerical parameter should be construed in light of the number of significant digits and ordinary rounding approaches.

For the purpose of the present description the terminology "wafer" has been consistently used, since this is the most commonly used term in the domain. The terminology "substrate" is also frequently used, depending on for instance the application domain. It should be understood though that these terms are interchangeable. Any piece or amount of material which has a shape which is essentially in the form of slice of material can be used.

In the following, "device wafer" means a wafer such as a semiconductor (e.g. silicon) or glass wafer, that can comprise devices, often CMOS devices and/or other devices, such as multi-chip modules (MCM) or micro-electromechanical structures (MEMS).

With a "carrier" or "wafer carrier" is meant a support that is placed underneath a wafer or device wafer as a mechanical support. This is especially useful after thinning the wafer, as a mechanical support to avoid breaking of the thin wafer during further handling/processing.

The total thickness variation (TTV)=maximum thickness−minimum thickness of a wafer.

In the semiconductor industry, the thickness of wafers is reduced for many applications. Backside grinding after the microelectronic devices fabrication is often used by the semiconductor industry to achieve die thicknesses down to 50 μm. However, in this thickness range (<100 μm), the wafer becomes flexible and a carrier (for example Si or glass wafer or a back grinding tape (BG-tape)) is used to provide mechanical support for the thin device wafer. The device wafer can be bonded to the carrier by means of a temporary glue layer (e.g. wax, resin or adhesive tape) or by using electrostatic force. Several products are available for this, depending on the requirements of the thinning process and following process steps. A problem with the use of a carrier and glue layer is that non-unifomities of the carrier and/or glue layer are transferred to the wafer during the thinning or grinding process, thereby increasing the total thickness variation of the thinned device wafer.

At present, thin device wafers are often in the range of 100-300 μm thickness with a few companies already moving below this mark. If no further processing is performed on wafer level after the thinning step (except for dicing), the TTV (Total Thickness Variation=maximum thickness−minimum thickness on a wafer) is not a great concern, for example for the subsequent packaging process.

However, as wafer thickness goes to ultra thin values (<50 μm) even a few microns TTV will represent a great percentage of the remaining device wafer thickness. Also, technologies like microfabricated interconnections or through-Si interconnection vias used in thin die embedding or 3D stacking require further processing on the device wafer after thinning and before dicing/packaging. Thus, it is advantageous to reduce the TTV as much as possible in order to allow/enable uniform processing on the device wafer at wafer level.

Thinning of a device wafer is often done in a tool suited for thinning a wafer, for example a grinding tool, polishing tool or CMP tool. Therefore the wafer 1 (see FIG. 1) can be attached to a carrier 2 for mechanical support. A first side 1a of the wafer 1 comprising the devices is attached with bonding means such as e.g. adhesive of glue 3 on the carrier 2. The wafer 1 is thinned at a second side 1b, essentially at the opposite side of the first side 1a.

Part (a) of FIG. 1 represents schematics of a bonding process of a wafer 1 on a wafer carrier 2. A device wafer 1 is attached to a wafer carrier 2 with bonding means such as glue 3 between the first side 1a of the wafer 1 and the carrier 2. All non-uniformities from the bonding process, due to the carrier 2, the wafer 1 and/or glue layer 3, will be summed and transferred to the complete stack. Part (b) of FIG. 1 illustrates how the stack, i.e. carrier 2+glue layer 3+device wafer 1 appears just after the bonding. It can be seen that the device wafer 1 shows some topography at its free second side 1b. The device wafer 1 typically should have a small TTV (<2 μm) as a requirement for microelectronic devices fabrication.

FIG. 2 shows the schematics of a prior art grinding process. Part (a) of FIG. 2 at the left shows the stack 5 consisting of carrier 2, glue 3 and wafer 1, clamped on a (vacuum) chuck 4 before grinding. Part (b) of FIG. 2 at the right shows the remaining part 10 of the device wafer 1 after the grinding process: the top surface 11 of the stack 5 is made parallel to the bottom surface clamped on the chuck 4, a part 12 of the original device wafer 1 being removed, in the example illustrated by a grinding process. The high TTV from the carrier/bonding is imprinted onto the thinned down device wafer 10 (as can be seen in part (c) of FIG. 1).

Since the grinding process is making the top surface 11 and bottom surface parallel (within the accuracy limits of the grinding tool) and the bottom surface is attached to the grinder chuck 4 by (vacuum) clamping, any non-uniformity from the carrier 2 (required for the mechanical support) will also be imprinted on the thinned device wafer 10 (FIGS. 1 and 2). This can be observed in particular in part (c) of FIG. 2, where the wafer 1 is represented after grinding the backside 1b of the wafer 1.

Furthermore the TTV is also influenced by the grinding process itself and the vacuum clamping. In the best case, the grinding process causes very little TTV (e.g. <1 um) and the vacuum clamping is good, i.e. so that any topography (different from that of the grinder chuck) is transferred from the clamping side to the other side of the wafer (stack) by wafer (stack) bending. A low TTV in the grinding process is often obtained using good grinder equipment (characterised by a low TTV after grinding a wafer and by a good wafer-to-wafer reproducibility) and good process control through careful calibration. Good vacuum clamping can be achieved as long as the thickness variations (i.e. the topography of the aforementioned second surface) are slowly varying laterally, which is typically the case using semiconductor, e.g. Si, or glass wafers.

In the same way, a carrier 2 with a very low TTV bonded with bonding material 3 and/or bonding process with a high TTV (e.g. through included particles), will result in a device wafer 1, 10 with high TTV.

The influence of the carrier 2, the bonding process, and the bonding material 3 are determining parameters for the final TTV. A carrier 2 and/or a bonding material 3 and/or bonding process with a high TTV will consequently imply a thin device 10 with a high TTV.

The method according to a particular embodiment of the present invention will be described below. The presented method allows decoupling the TTV on the thinned wafer 100 from the characteristics (mainly TTV) of the carrier 2 and bonding process and/or bonding material 3, e.g. adhesion layer or glue layer. The resulting TTV of the device wafer 100 after thinning is less sensitive to the thickness uniformity of the carrier 2 and of the thickness and uniformity of the bonding material 3, e.g. adhesive or glue layer 3. In the present invention, the quality of the adhesive 3 may be important. In case of bad bonding, e.g. if there are voids between the carrier 2 and the device wafer 1, there will be a large TTV on the final thinned device wafer 10. Voids and air bubbles create compliant regions that cannot be compensated by the thinning process, not even in case of double side grinding as in accordance with embodiments of the present invention.

As a result of the present invention, the TTV and non-uniformities of the carrier 2 and thickness variations and non-uniformities in the adhesion or glue layer 3 do not have an important influence on the resulting TTV on the thinned device wafer 10. That way it is possible to achieve in a very reproducible way very low TTV, even below 1 μm, on the device wafer 10 after thinning.

The presented method allows reducing the cost, as carriers 2 with lower TTV requirements can be used and less stringent requirements can be used for the adhesion or glue layer 3, thereby still obtaining low TTV for the device wafer 10 after thinning.

Since commonly used grinding or thinning processes for thinning wafers 1 are making the top and bottom surfaces parallel (see FIG. 2 and experiments presented in FIGS. 4 and 5), non-uniformities of the bonding or glue layer 3 and carrier 2 are imprinted on the device wafer 1, thereby increasing the final TTV.

To solve this problem a two-step process is presented to imprint the combined thickness non-uniformities of both carrier 2 and glue layer 3 (including possibly particles that are trapped in between the 2 wafers) essentially on the carrier 2 first and then proceed with the device wafer thinning in a second step. The resulting thinned device wafer 10 has a low TTV, as required for further processing.

This method is applicable to many thinning equipments/techniques such as, but not limited to grinding process, CMP, polishing, Fly-cutting or any other method used for thinning wafers 1. It can be applied to thinning techniques that perform thinning or material removal essentially parallel to a chuck 4 (for example vacuum chuck). In other words the method can be applied to techniques removing material parallel with respect to a reference surface (for example chuck) in combination with a chuck with good "chucking" capabilities.

Good chucking capability means that the wafer is clamped against the chuck all over the wafer surface on (almost) all locations of the wafer surface. When chucking is less effective, for example the wafer is not fully clamped on the chuck, the resulting TTV after thinning will be higher. The resulting TTV depends on the chucking capabilities. A vacuum chuck for example often gives good results, but also other "chucking" techniques can be used, such as electrostatic chucks, . . . The chuck may have a pre-determined shape on a microscopic scale, e.g. convex or bent, while at the same time it may be microscopically flat. In case the chuck has a certain pre-determined shape, for example a cone, the thinning process can thin the wafer parallel to the chuck.

The first step of a method according to embodiments of the present invention (see part (a) of FIG. 3) comprises thinning of the carrier 2, thereby imprinting the combined thickness non-uniformities of both carrier 2 and glue layer 3 essentially on the carrier 2. In this step, first the wafer 1 to be thinned is bonded on a carrier 2 by means of a bonding layer 3, e.g. glue or adhesive. The carrier 2 can be made of any material used in the field, for example another Si wafer or a glass wafer. As bonding material 3 or glue layer or adhesion layer, any material used in the field can be used, for example spin on materials like the HT250® provided by Brewer Science.

As seen on the right hand side of part (a) of FIG. 3, the stack 5 comprising the carrier 2, the glue layer 3 and the device wafer 1 are flipped or turned over and installed on the chuck 4 of the tool for thinning the wafer, for example a polishing tool, with the device wafer 1 in contact with the chuck 4. The carrier 2 is thinned on the tool, for example a grinding machine, thereby removing a part 21 of the carrier 2 and providing a thinned carrier 20. In the best case thinning of the carrier 2 is done to a thickness such that the thickness non-uniformities of the stack are imprinted on one side of the thinned carrier 20. For example, if the bonding process and/or bonding material 3 introduce 50 µm TTV on the total stack, more than 50 µm can be removed from the carrier 2 such that the total topography is imprinted on one side of the thinned carrier 20. So the thickness of the part 21 that is removed from the carrier 2 is in the best case more than the TTV of the total stack 5. If less material is removed, the resulting TTV of the thinned device wafer 10 will be higher. According to embodiments of the invention, when the stack 5 is clamped to the chuck as shown in part (a) of FIG. 3, the combined non-uniformities are imprinted on the carrier 2. During grinding of the carrier 2, a thickness may be removed from the carrier 2 which corresponds at least to the imprinted combined non-uniformities, so that the carrier backside is made essentially flat (see right hand side of part (a) and left hand side of part (b) of FIG. 3).

In the second step (part (b) of FIG. 3), thinning of the device wafer 1 is done. Therefore the partially thinned down stack 6 is flipped or turned over again as to proceed with the thinning of the device wafer 1 to the final desired thickness. This step can be done in the same tool and the thinning material/slurry can be changed in case the carrier wafer 2 is made of a material different from the device wafer 1. This step can also be done in another tool that is optimised for thinning device wafers 1. For example a tool that provides wafers and/or stacks with parallel bottom and top surfaces. Since all TTV was already imprinted on the carrier 20, the device wafer 100 thinned in accordance with embodiments of the present invention by removing a part 110 will have a TTV in the same range as it had before the thinning process. This facilitates further processing on the thinned wafer 100. Part (c) of FIG. 3 shows a thinned device wafer 100 after release from the thinned carrier 20. When the backside of the carrier 20 is made essentially flat, it doesn't show any irregularities and no TTV is imprinted on the wafer 1, so that it can be polished with a low TTV on both sides.

In order to reach the low TTV on the thinned device wafer 100, a low TTV of the thinning process (for example grinding) is advantageous.

Also in the best case, the chuck 4 (for example vacuum chuck) can transfer it's own topography (if the grinder chuck is not flat) from one side of the stack to the other one.

Apart from the ability to obtain a very good TTV of the final thin device wafer 100 independently of the TTV of both the carrier 2 and the bonding layer, e.g. glue layer 3, some decrease in TTV will also be obtained if the very same tool setup (chuck tilt, recipe, and grinding wheel) is being used for both step 1 (thinning of the carrier 2) and step 2 (thinning of the device wafer 1). By using the same (small) irregularities in the thinning process (for example non-perfect plan-parallelism of the grinding wheel and the (vacuum) chuck 4 in a grinding process), some of the effects of these irregularities will be decreased (by subtracting them), resulting in a smaller TTV.

Experiment

FIG. 4 shows real wafer scans where the TTV from the carrier/bonding is imprinted on the device wafer 1, as in the prior art. The wafer 1 is a blanket 8" silicon wafer. The carrier 2 is a glass wafer and the glue 3 used was the QS135® provided by Electron Microscopy Sciences. Part (a) of FIG. 4 at the top shows a double edge spin on the wax glue layer 3 on a carrier wafer 2 that is used for the bonding process. The result is a step of about 1 µm high and 10 mm wide at the border. In part (b) of FIG. 4, a thickness map after thinning is shown. The step height of the glue layer 3 is imprinted as a depression on the backside thinned device wafer 10. Part (c) of FIG. 4 shows a scan of an 8" Si wafer after bonding and grinding, showing the influence of wax TTV on the thinned device wafer 10. It can clearly be observed that the wafer 10 is thinner at the edge due to the wax glue layer 3 used on the carrier wafer 2.

Experiment

FIG. 5 shows real wafer scans where the TTV from the carrier/bonding is imprinted on the device wafer 1, as in the prior art. The wafer 1 is an 8" silicon wafer with a blanket Al thin film on the bonded surface. The carrier 2 is made of glass and the glue used was the QS135® provided by Electron Microscopy Sciences. Part (a) of FIG. 5 shows a thickness map of an 8" Si wafer after bonding and grinding using a bonding procedure different from FIG. 4, i.e. a much thicker glue layer QS135® was used to obtain the results in FIG. 5. Part (b) of FIG. 5 shows the thickness profile of the scan presented in part (a) of FIG. 5 along the dashed arrow. The device wafer 10 presents a TTV of more than 15 µm after the grinding process as a result of the high TTV of the carrier 2 and bonding process and/or bonding materials 3.

Experiment

In this experiment the two-step process described above in accordance with embodiments of the present invention is used (as illustrated in FIG. 3). Thereby the combined thickness non-uniformities of both the carrier 2 and the glue layer 3 (including possibly particles that are trapped in between the two wafers 1, 2) are imprinted essentially on the carrier 2. Subsequently device wafer 1 thinning is done. That way a device wafer 100 with low TTV can be fabricated, as may be required for further processing.

After bonding the wafer 1 to be thinned on the glass carrier 2 (with an initial TTV of about 10 µm) using the QS135® glue 3, the stack 5 with glass carrier 2 and QS135® glue 3 is flipped or turned over. Then the carrier 2 is thinned using a grinding machine (DFG8560 from DISCO) removing about 50 µm from its original thickness. This allows to imprint the thickness non-uniformities on the carrier 2.

After thinning the carrier 2, the stack 6 is flipped again as to proceed with the thinning of the device wafer 1 to the final desired thickness (110 µm nominal value). Since all TTV was already imprinted on the carrier 2, the device wafer 100 will have a TTV in the same range as it had before the thinning process (being about 3 µm).

Part (a) of FIG. 6 shows a wafer mapping of the wafer thickness and part (b) of FIG. 6 shows the cross section thickness profile of the scan presented in part (a) of FIG. 6 along the dashed arrow. This shows that a TTV of less than 1 um can be achieved on a wafer stack processed according to particular embodiments of the present invention.

As in the experiment the Si wafer 1 was bonded to the carrier 2 using the same bonding process as for FIG. 5, the differences between FIG. 5 and FIG. 6 indicate that a much lower TTV can be achieved with the double sided grinding in accordance with embodiments of the present invention (see FIG. 6) than in case of single sided grinding (see FIG. 5), and even better than its original TTV (being about 3 µm). So the double side grinding method according to embodiments of the present invention allows to obtain a thinned 8 inch Si device wafer 100 with TTV of only 1.0 µm. As a result, other process steps (polishing, lithography, wet/dry etch, deposition) can be uniformly performed at wafer level on this wafer.

The invention claimed is:

1. A method for thinning a wafer, comprising:
   providing a device wafer having a first surface and a second surface essentially parallel to each other;
   providing a carrier having a first surface and a second surface essentially parallel to each other;
   bonding the first surface of the device wafer to the first surface of the carrier, whereby a composite substrate is obtained;
   clamping the second surface of the device wafer to a first reference surface; thereafter
   removing material from the second surface of the carrier in the composite substrate; thereafter
   clamping the second surface of the carrier to a second reference surface; thereafter
   removing material from the second surface of the device wafer in the composite substrate; and
   removing the wafer from the carrier, whereby a thinned wafer is obtained.

2. The method of claim 1, wherein at least one of removing material from the second surface of the carrier in the composite substrate and removing material from the second surface of the device wafer in the composite substrate is done by grinding.

3. The method of claim 1, wherein bonding the first surface of the wafer to the first surface of the carrier comprises applying a glue layer between the first surface of the wafer and the first surface of the carrier.

4. The method of claim 1, wherein the thinned device wafer has a thickness below 50 microns and a total thickness variation below 2 microns.

5. The method of claim 1, wherein at least one of removing material from the second surface of the carrier in the composite substrate or removing material from the second surface of the device wafer in the composite substrate is done by a method selected from the group consisting of fly cutting and chemical mechanical polishing.

6. The method of claim 1, wherein the device wafer has a thickness of more than 600 microns before thinning.

7. The method of claim 1, wherein the device wafer has a thickness of more than 400 microns before thinning.

8. The method of claim 1, wherein the device wafer has a thickness of more than 200 microns before thinning.

9. The method of claim 1, wherein at least one of the device wafer and the carrier comprises a semiconductor material.

10. The method of claim 1, wherein at least one of the device wafer or the carrier comprises at least one material selected from the group consisting of silicon, germanium, compound semiconductors, and glass.

11. The method of claim 1, wherein removing material from the second surface of the carrier in the composite substrate comprises removing material such that the second surface of the carrier is essentially parallel to the first reference surface; and wherein removing material from the second surface of the device wafer in the composite substrate comprises removing material such that the second surface of the wafer is essentially parallel to the second reference surface.

12. The method of claim 11, wherein the first reference surface and the second reference surface are the same.

13. The method of claim 11, wherein the first reference surface is a first chuck and the second reference surface is a second chuck.

14. The method of claim 1, wherein the device wafer has a thickness of more than 100 microns before thinning.

15. The method of claim 14, wherein the thinned wafer has a thickness of below 50 microns.

16. The method of claim 14, wherein the thinned wafer has a thickness of below 40 microns.

17. The method of claim 14, wherein the thinned wafer has a thickness of below 30 microns.

18. The method of claim 14, wherein the thinned wafer has a thickness of below 20 microns.

19. The method of claim 14, wherein the thinned wafer has a thickness of below 10 microns.

20. The method of claim 14, wherein the thinned wafer has a thickness of below 5 microns.

* * * * *